(12) United States Patent
An et al.

(10) Patent No.: US 12,049,154 B2
(45) Date of Patent: Jul. 30, 2024

(54) BATTERY CONTROL SYSTEM, BATTERY PACK, ELECTRIC VEHICLE, AND ID SETTING METHOD FOR THE BATTERY CONTROL SYSTEM

(71) Applicant: LG ENERGY SOLUTION, LTD., Seoul (KR)

(72) Inventors: Yang-Soo An, Daejeon (KR); Gyu-Yeol Lee, Daejeon (KR); Sang-Jin Lee, Daejeon (KR); Dae-Gon Jeon, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 413 days.

(21) Appl. No.: 17/615,510

(22) PCT Filed: Feb. 4, 2021

(86) PCT No.: PCT/KR2021/001504
§ 371 (c)(1),
(2) Date: Nov. 30, 2021

(87) PCT Pub. No.: WO2021/162348
PCT Pub. Date: Aug. 19, 2021

(65) Prior Publication Data
US 2022/0314832 A1  Oct. 6, 2022

(30) Foreign Application Priority Data
Feb. 13, 2020 (KR) .................. 10-2020-0017878

(51) Int. Cl.
*B60L 58/18* (2019.01)
*B60L 58/10* (2019.01)
(Continued)

(52) U.S. Cl.
CPC ............... *B60L 58/18* (2019.02); *B60L 58/10* (2019.02); *G01R 31/382* (2019.01);
(Continued)

(58) Field of Classification Search
CPC ....... B60L 58/18; B60L 58/10; G01R 31/382; G01R 31/396; H01M 10/482;
(Continued)

(56) References Cited

U.S. PATENT DOCUMENTS 8,904,049 B2 * 12/2014 McCormick ........ G06F 13/4282
429/61
9,477,616 B2   10/2016 Rivers et al.
(Continued)

FOREIGN PATENT DOCUMENTS

EP   2293375 A1 *  3/2011  .......... H01M 10/425
EP   2 899 556 A1   7/2015
(Continued)

OTHER PUBLICATIONS

Extended European Search Report dated Oct. 26, 2022, issued by the European Patent Office in corresponding European Patent Application No. 21754243.0.
(Continued)

*Primary Examiner* — Richard Isla
*Assistant Examiner* — Manuel Hernandez
(74) *Attorney, Agent, or Firm* — Morgan, Lewis & Bockius LLP

(57) ABSTRACT

A battery control system includes first to third signal paths, and first to $n^{th}$ battery controllers. When a high level voltage is inputted through the second signal path, the first battery controller sets an ID of the first battery controller based on ID information collected through the first signal path and outputs the high level voltage to the second signal path. Where i is a natural number of 2~n, when the high level
(Continued)

voltage outputted by the $i-1^{th}$ battery controller is inputted through the second signal path, the $i^{th}$ battery controller sets an ID of the $i^{th}$ battery controller and outputs the high level voltage to the second signal path. When the high level voltage is outputted to the third signal path by the $n^{th}$ battery controller, each battery controller outputs a response signal to the first signal path.

12 Claims, 8 Drawing Sheets

(51) Int. Cl.
    *G01R 31/382*     (2019.01)
    *G01R 31/396*     (2019.01)
    *H01M 10/48*     (2006.01)
    *H02J 7/00*     (2006.01)

(52) U.S. Cl.
    CPC ........ *G01R 31/396* (2019.01); *H01M 10/482* (2013.01); *H02J 7/00032* (2020.01); *H02J 7/00034* (2020.01); *H02J 7/0013* (2013.01); *H02J 7/0047* (2013.01); *H02J 7/0029* (2013.01)

(58) Field of Classification Search
    CPC .... H02J 7/00032; H02J 7/0013; H02J 7/0047; H02J 7/0029
    USPC .......................................... 320/116
    See application file for complete search history.

(56) References Cited

U.S. PATENT DOCUMENTS

| | | | | |
|---|---|---|---|---|
| 10,243,923 | B2* | 3/2019 | Jo | H04L 25/4902 |
| 11,265,223 | B2* | 3/2022 | Kim | H04Q 9/00 |
| 2011/0140533 | A1* | 6/2011 | Zeng | H01M 10/482 |
| | | | | 307/80 |
| 2011/0175574 | A1* | 7/2011 | Sim | H01M 10/482 |
| | | | | 320/121 |
| 2011/0273023 | A1 | 11/2011 | Nishida et al. | |
| 2011/0279087 | A1* | 11/2011 | Andres | H01M 10/482 |
| | | | | 320/134 |
| 2012/0268069 | A1 | 10/2012 | Park et al. | |
| 2013/0106360 | A1 | 5/2013 | Gaylo et al. | |
| 2013/0227316 | A1* | 8/2013 | Bengtsson | B60L 58/16 |
| | | | | 713/300 |
| 2014/0018990 | A1* | 1/2014 | Kataoka | B60L 58/21 |
| | | | | 320/134 |
| 2014/0059260 | A1* | 2/2014 | McCormick | G06F 13/42 |
| | | | | 710/110 |
| 2014/0091769 | A1* | 4/2014 | Kim | H02J 7/0013 |
| | | | | 320/134 |
| 2014/0300364 | A1 | 10/2014 | Choi | |
| 2014/0365792 | A1* | 12/2014 | Yun | H02J 7/00047 |
| | | | | 713/320 |
| 2015/0069974 | A1* | 3/2015 | Okada | H02J 13/00016 |
| | | | | 320/134 |
| 2015/0171642 | A1 | 6/2015 | Kato et al. | |
| 2016/0020622 | A1* | 1/2016 | Kwon | H02J 7/0013 |
| | | | | 320/128 |
| 2017/0222275 | A1* | 8/2017 | Krishnan | H01M 10/425 |
| 2017/0237707 | A1 | 8/2017 | Jo | |
| 2018/0145519 | A1 | 5/2018 | Trigiani | |
| 2018/0269543 | A1* | 9/2018 | Kim | H01M 10/46 |
| 2018/0287218 | A1* | 10/2018 | Lim | H01M 10/425 |
| 2018/0352010 | A1* | 12/2018 | Sakaguchi | H04L 65/1069 |
| 2021/0143648 | A1* | 5/2021 | Yeom | H02J 7/0047 |
| 2021/0362623 | A1* | 11/2021 | Hori | G01R 31/3835 |
| 2023/0065241 | A1* | 3/2023 | Suzuki | H04L 12/40 |

FOREIGN PATENT DOCUMENTS

| | | | | |
|---|---|---|---|---|
| EP | 3287802 | A1 * | 2/2018 | ............ G01R 19/00 |
| EP | 3657815 | A1 * | 5/2020 | ........ H01M 10/4207 |
| JP | 2005-217945 | A | 8/2005 | |
| JP | 4796119 | B2 | 10/2011 | |
| KR | 10-2011-0013747 | A | 2/2011 | |
| KR | 10-1245279 | B1 | 3/2013 | |
| KR | 10-2013-0033197 | A | 4/2013 | |
| KR | 20130058373 | A * | 6/2013 | |
| KR | 20130095424 | A * | 8/2013 | |
| KR | 10-2014-0078323 | A | 6/2014 | |
| KR | 10-2014-0143076 | A | 12/2014 | |
| KR | 10-1754948 | B1 | 7/2017 | |
| KR | 10-2017-0098451 | A | 8/2017 | |
| KR | 10-1768251 | B1 | 8/2017 | |
| KR | 20200031931 | A * | 3/2020 | |
| WO | WO-2010067724 | A1 * | 6/2010 | .......... G01R 31/396 |
| WO | WO-2012050275 | A1 * | 4/2012 | ........ H01M 10/4207 |
| WO | WO-2013036034 | A2 * | 3/2013 | ............ H02J 7/0013 |
| WO | WO-2013125850 | A1 * | 8/2013 | .......... B60L 11/1861 |
| WO | WO-2014030944 | A1 * | 2/2014 | .......... B60L 11/1864 |
| WO | WO-2015034262 | A1 * | 3/2015 | .............. B60L 58/18 |
| WO | WO-2016056845 | A1 * | 4/2016 | .......... G06F 13/4068 |
| WO | WO-2017105046 | A1 * | 6/2017 | ............. G01R 19/00 |
| WO | WO-2020071682 | A1 * | 4/2020 | .......... H01M 10/425 |
| WO | WO-2021162348 | A1 * | 8/2021 | ................ B60L 1/00 |

OTHER PUBLICATIONS

International Search Report issued in corresponding International Patent Application No. PCT/KR2021/001504 dated May 18, 2021.

* cited by examiner

BATTERY CONTROL SYSTEM, BATTERY PACK, ELECTRIC VEHICLE, AND ID SETTING METHOD FOR THE BATTERY CONTROL SYSTEM

TECHNICAL FIELD

The present disclosure relates to technology that allocates IDs to a plurality of battery controllers of a battery control system in a sequential order.

The present application claims the benefit of Korean Patent Application No. 10-2020-0017878 filed on Feb. 13, 2020 with the Korean Intellectual Property Office, the disclosure of which is incorporated herein by reference in its entirety.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

A battery pack for devices requiring high capacity and high voltage such as electric vehicles generally includes a plurality of battery modules connected in series.

A battery control system having a multi slave system is disclosed to efficiently manage the plurality of battery modules. The battery control system includes a plurality of battery controllers provided in a one-to-one relationship with the plurality of battery modules to monitor and control the state of the plurality of battery modules. The plurality of battery controllers may be all managed by one of them or a separate upper level controller. For smooth transmission and reception of data between the plurality of battery controllers and/or between the plurality of battery controllers and the upper level controller, it is necessary to set an ID as a unique identifier for each battery controller. Patent Literature 1 discloses wherein a master as the upper level controller allocates IDs to a plurality of slaves as battery controllers in a sequential order. However, the ID allocation according to Patent Literature 1 needs the master, making the process complicated, and involves detecting a potential difference between the electrode (positive or negative) of each of the plurality of batteries and the ground.

(Patent Literature 1) Korean Patent Publication No. 10-2011-0013747 (Publication Date: Feb. 10, 2011)

DISCLOSURE

Technical Problem

The present disclosure is designed to solve the above-described problem, and therefore the present disclosure is directed to providing a battery control system in which IDs are sequentially allocated to a plurality of battery controllers in the order in which the battery controllers are connected to one another without intervention of an upper level controller, a battery pack, an electric vehicle and an ID setting method for the battery control system.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

A battery control system according to an aspect of the present disclosure includes first to third signal paths, and first to $n^{th}$ battery controllers interconnected through the first to third signal paths. n is a natural number of 2 or greater. When a high level voltage as a command to start an ID setting sequence is inputted to the first battery controller through the second signal path, the first battery controller is configured to collect ID information indicating an ID allocation status of the first to $n^{th}$ battery controllers through the first signal path, set an ID of the first battery controller based on the ID information, and output the high level voltage to the second battery controller through the second signal path. When the high level voltage outputted by the $i-1^{th}$ battery controller is inputted to the $i^{th}$ battery controller through the second signal path, the $i^{th}$ battery controller is configured to collect the ID information through the first signal path, set an ID of the $i^{th}$ battery controller based on the ID information collected by the $i^{th}$ battery controller, and output the high level voltage to the second signal path. i is a natural number of 2~n. The high level voltage outputted to the second signal path by the $n^{th}$ battery controller is inputted to all the first to $n^{th}$ battery controllers through the third signal path. Each battery controller is configured to output a response signal indicating completion of the ID setting sequence to the first signal path when the high level voltage is inputted through the third signal path.

Each battery controller includes a communication terminal, an input terminal, an output terminal and a check terminal. The communication terminal of each battery controller is coupled to the first signal path to collect the ID information. The input terminal of the first battery controller is coupled to an external power source through the second signal path, wherein the external power source outputs the high level voltage. The input terminal of the $i^{th}$ battery controller is coupled to the output terminal of the $i-1^{th}$ battery controller through the second signal path, wherein the high level voltage is outputted from the output terminal of the $i-1^{th}$ battery controller. The check terminal of each battery controller is coupled to the output terminal of the $n^{th}$ battery controller through the third signal path.

The $j^{th}$ battery controller may be configured to output an error message from the communication terminal of the $j^{th}$ battery controller when the high level voltage is inputted to the check terminal of the $j^{th}$ battery controller before the high level voltage is outputted from the output terminal of the $j^{th}$ battery controller. j is a natural number of n or smaller.

The $j^{th}$ battery controller may be configured to set the ID of the $j^{th}$ battery controller being equal to a sum of a maximum value of the ID information collected by the $j^{th}$ battery controller and a predetermined increment. j is a natural number of n or smaller.

When the ID of the $j^{th}$ battery controller is set, the $j^{th}$ battery controller may be configured to output the ID set for the $j^{th}$ battery controller through the communication terminal at least one time while the high level voltage is inputted to the input terminal of the $j^{th}$ battery controller. j is a natural number of n or smaller.

When the ID of the $j^{th}$ battery controller is set, the $j^{th}$ battery controller may be configured to output the high level voltage from the output terminal of the $j^{th}$ battery controller while the high level voltage is inputted to the input terminal of the $j^{th}$ battery controller. j is a natural number of n or smaller.

The $j^{th}$ battery controller may be configured to terminate the ID setting sequence in response to the high level voltage being inputted to the check terminal of the $j^{th}$ battery controller while the high level voltage is outputted from the output terminal of the $j^{th}$ battery controller. j is a natural number of n or smaller.

The battery control system may further include a sequence termination circuit including a resistor coupled between the input terminal of the first battery controller and the external power source; and a first switch electrically coupled between the resistor and a ground. The first switch may be turned on in response to the high level voltage outputted to the third signal path. When the first switch is turned on, the high level voltage from the external power source may be shut off from the input terminal of the first battery controller.

The battery control system may further include a second switch coupled between the input terminal of the first battery controller and the external power source. The second switch is turned off in response to the high level voltage outputted to the third signal path. When the second switch is turned off, the high level voltage from the external power source may be shut off from the input terminal of the first battery controller.

A battery pack according to another aspect of the present disclosure includes the battery control system.

An electric vehicle according to still another aspect of the present disclosure includes the battery pack.

An ID setting method for the battery control system according to yet another aspect of the present disclosure includes collecting, by the $j^{th}$ battery controller, the ID information indicating the ID allocation status of the first to $n^{th}$ battery controllers through the first signal path when the high level voltage is inputted to the $j^{th}$ battery controller through the second signal path, setting, by the $j^{th}$ battery controller, the ID of the $j^{th}$ battery controller based on the ID information, outputting, by the $j^{th}$ battery controller, the high level voltage to the second signal path after the ID setting of the $j^{th}$ battery controller is completed, and outputting, by the $j^{th}$ battery controller, the response signal indicating completion of the ID setting sequence of the $j^{th}$ battery controller to the first signal path when the high level voltage is inputted to the $j^{th}$ battery controller through the third signal path after the high level voltage is outputted to the second signal path by the $j^{th}$ battery controller.

Advantageous Effects

According to at least one of the embodiments of the present disclosure, IDs may be sequentially allocated to a plurality of battery controllers in the order in which the battery controllers are connected to one another without intervention of an upper level controller.

According to at least one of the embodiments of the present disclosure, at least one of the plurality of battery controllers may detect an error situation in progress of the ID setting sequence, and automatically share the error situation with the remaining battery controllers.

The effects of the present disclosure are not limited to the effects mentioned above, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Figure 1:
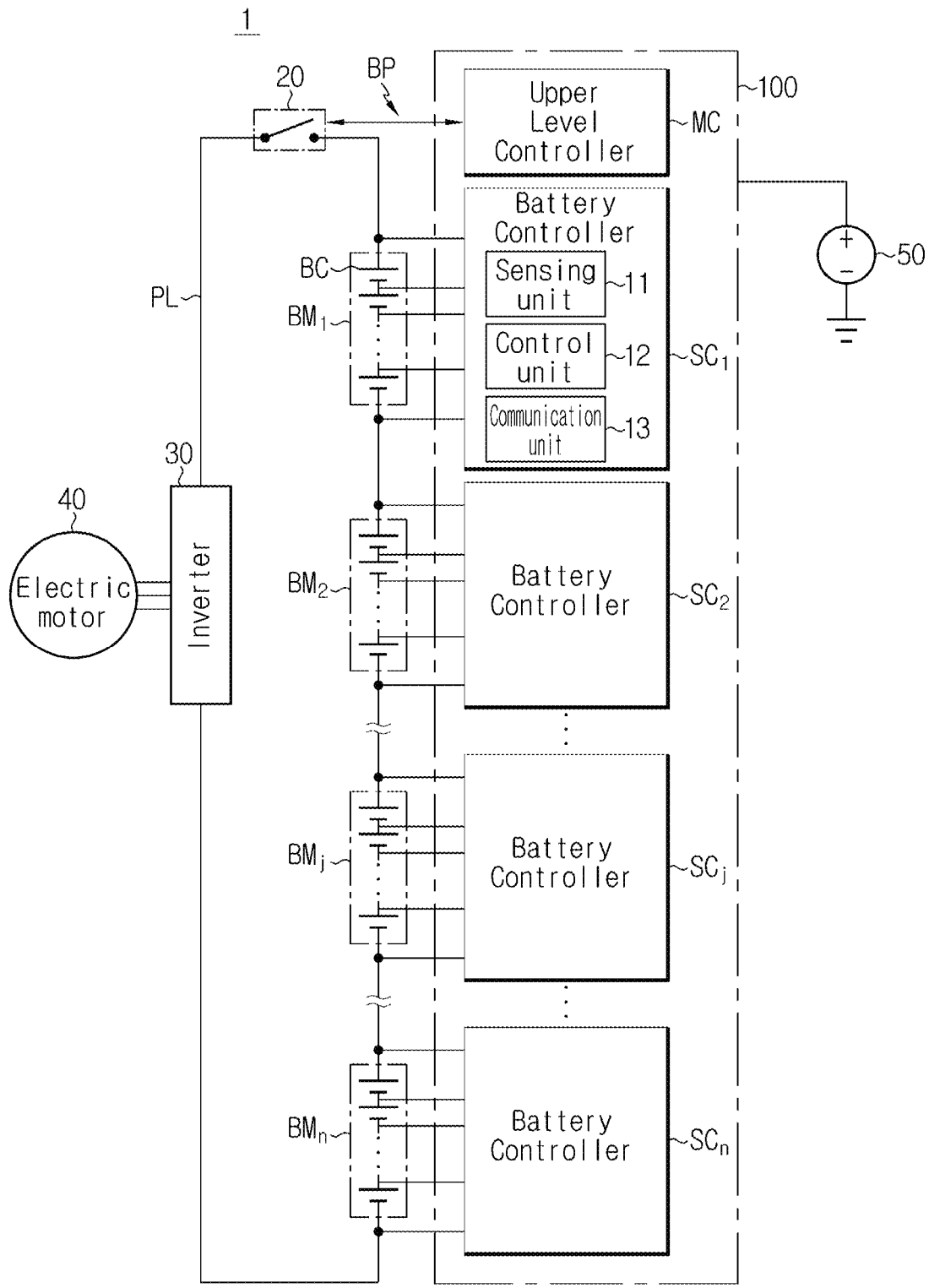
FIG. 1 is a diagram exemplarily showing a configuration of an electric vehicle according to the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and this may be implemented by hardware and software either alone or in combination.

In addition, throughout the specification, it will be further understood that when an element is referred to as being "connected to" another element, it can be directly connected to the other element or intervening elements may be present.

FIG. 1 is a diagram exemplarily showing a configuration of an electric vehicle according to the present disclosure.

Referring to FIG. 1, the electric vehicle 1 includes a battery pack BP, a relay 20, an inverter 30, an electric motor 40 and an external power source 50.

The battery pack BP may supply power required to drive the electric motor 40 of the electric vehicle 1. The battery pack BP includes a plurality of battery modules $BM_1 \sim BM_n$. In the specification, the subscript symbol n used as the reference symbol is a natural number of 2 or greater, and the symbol j is a natural number of n or smaller. The plurality of battery modules $BM_1 \sim BM_n$ is connected in series and/or in parallel. Each of the plurality of battery modules $BM_1 \sim BM_n$ includes at least one battery cell BC. The battery cell BC may be a lithium ion battery cell BC. The battery cell BC is not limited to a particular type and may include any type of battery cell that can be repeated recharged.

The relay 20 is installed on a power line PL connecting the battery pack BP to the inverter 30. The relay 20 is controlled to be turned on/off in response to a switching signal from a battery control system 100.

The inverter 30 is provided to convert the direct current from the battery pack BP to an alternating current in response to a control signal from the battery control system 100 while the relay 20 is in a turn-on state. The electric motor 40 is a 3-phase alternating motor, and works by the alternating current power generated by the inverter 30.

The external power source 50 is installed in the electric vehicle 1 to supply electrical energy required for the operation of a peripheral device (not shown) installed in the electric vehicle 1. For example, the external power source 50 may include a lead storage battery. The peripheral device may include a heater, an air conditioner, a lighting or the like.

The battery pack BP further includes the battery control system 100.

The battery control system 100 includes a plurality of battery controllers $SC_1 \sim SC_n$. The battery control system 100 may further include an upper level controller MC.

The plurality of battery controllers $SC_1 \sim SC_n$ is provided in a one-to-one relationship with the plurality of battery modules $BM_1 \sim BM_n$. The following description of the battery controller $SC_j$ is common to the plurality of battery controllers $SC_1 \sim SC_n$ respectively.

The battery controller $SC_j$ is configured to monitor a state (for example, voltage, current, temperature, State of Charge, State of Health) of the battery module $BM_j$. The battery controller $SC_j$ may include a sensing unit 11, a control unit 12 and a communication unit 13.

The sensing unit 11 may include at least one of a voltage detection circuit, a current detection circuit and a temperature detection circuit. The voltage detection circuit may measure a voltage across each battery cell BC included in the battery module $BM_j$ and output a signal indicating the measured voltage of each battery cell BC to the control unit 12. The current detection circuit may detect a current flowing through the battery module $BM_j$, and output a signal indicating the detected current to the control unit 12. The temperature detection circuit may detect a temperature of the battery module $BM_j$, and output a signal indicating the detected temperature to the control unit 12.

The control unit 12 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing other functions. The control unit 12 may have memory embedded therein. The memory may store programs and data necessary to perform methods as described below. The memory may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM). The control unit 12 may generate battery information indicating the state of the battery module $BM_j$ based on the signals from the sensing unit 11, and store the generated battery information in the memory.

The communication unit 13 is operably coupled to the control unit 12, and transmits the battery information from the control unit 12 to the upper level controller MC and/or the other battery controller SC. The operably coupled refers to connection between two elements to transmit and receive a signal in one or two directions.

The power required for the operation of the battery controller $SC_j$ may be supplied from the battery module $BM_j$ and/or the external power source 50. Before an ID setting sequence as described below is executed, the battery controller $SC_j$ may have an arbitrary identifier set to a predetermined initial value (for example, 0).

The external power source 50 provides a high level voltage (for example, 12V) as a signal for commanding to start the ID setting sequence for the plurality of battery controllers $SC_1 \sim SC_n$. In the specification, the high level voltage represents a voltage signal of a predetermined voltage (for example, 3V) or above. Accordingly, when the battery pack BP is installed in the electric vehicle 1 and the battery control system 100 is electrically coupled to the external power source 50, the ID setting sequence for the plurality of battery controllers $SC_1 \sim SC_n$ may automatically start.

The upper level controller MC is configured to manage all the plurality of battery modules $BM_1 \sim BM_n$ using the plurality of battery controllers $SC_1 \sim SC_n$. The upper level controller MC may communicate with the battery controller $SC_j$ via a wired network such as local area network (LAN), controller area network (CAN) and/or a wireless network such as Bluetooth, Zigbee and WiFi. After the ID setting has been normally completed for the plurality of battery controllers $SC_1 \sim SC_n$, the upper level controller MC controls the charge/discharge of the plurality of battery modules $BM_1 \sim BM_n$ based on the battery information from the plurality of battery controllers $SC_1 \sim SC_n$. For example, when the battery information from the battery controller $SC_j$ indicates an abnormal condition (for example, overvoltage, overdischarge, overheat) of at least one battery cell BC in the battery module $BM_j$, the upper level controller MC may turn off the relay 20 to protect the battery module $BM_j$. The hardware configuration of the upper level controller MC may be the same as that of the battery controller $SC_j$ except that the sensing unit 11 may be omitted.

Alternatively, the upper level controller MC is omitted from the battery control system 100, and instead, one (for example, $SC_1$) of the plurality of battery controllers $SC_1 \sim SC_n$ may take charge of the function (position) of the upper level controller MC. In this case, the battery controller (for example, $SC_1$) in charge of the function of the upper level controller MC may be referred to as 'master', and each of the remaining battery controllers SC may be referred to as 'slave'.

Figure 2:
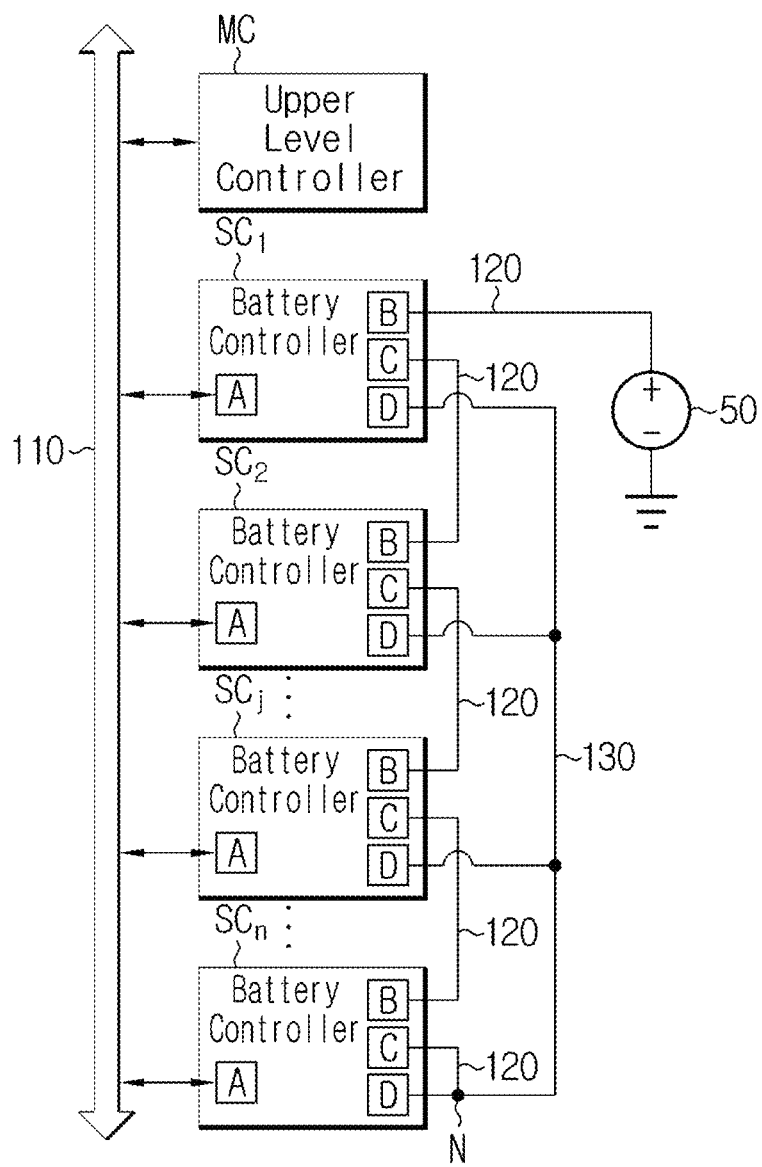
FIG. 2 is a diagram schematically showing a signal network for setting IDs of a plurality of battery controllers according to a first embodiment of the present disclosure.

FIG. 2 is a diagram schematically showing a signal network for setting IDs of a plurality of battery controllers according to a first embodiment of the present disclosure.

Referring to FIGS. 1 and 2, the battery control system 100 further includes a first signal path 110, a second signal path 120 and a third signal path 130. Each of the plurality of battery controllers $SC_1 \sim SC_n$ includes a communication terminal A, an input terminal B, an output terminal C and a check terminal D. The communication unit 13 of the battery controller $SC_j$ may be operably coupled to the communication terminal A, the input terminal B, the output terminal C and the check terminal D of the battery controller $SC_j$.

The communication terminal A of the battery controller $SC_j$ is coupled to the first signal path 110. The battery controller $SC_j$ outputs a value indicating an ID set for the battery controller $SC_j$ to the first signal path 110. When the ID is not yet set for the battery controller $SC_j$, the battery controller $SC_j$ may output an initial value indicating that the ID was not set to the first signal path 110. The battery controller $SC_j$ collects data indicating the ID set for the other battery controller SC through the first signal path 110. That is, the first signal path 110 serves as a communication channel for transmission and reception of ID information between the plurality of battery controllers $SC_1 \sim SC_n$. The ID information indicates the ID allocation status of the plurality of battery controllers $SC_1 \sim SC_n$. The ID information may include information indicating to which one of the plurality of battery controllers $SC_1 \sim SC_n$ the ID has been set, and information indicating the value of the ID set for each battery controller SC. For example, in case that the value of the ID is sequentially set for the plurality of battery controllers $SC_1 \sim SC_n$ in an ascending order of from 1 to n, the maximum value of the ID information collected at a specific time point being 3 indicates that the value of the ID set for the battery controller $SC_1$ is 1, the value of the ID set for the battery controller $SC_2$ is 2, the value of the ID set for the battery controller $SC_3$ is 3, and the IDs for the battery controller $SC_4 \sim SC_n$ are not yet set.

The second signal path 120 may be a series communication channel that connects the input terminal B and the output terminal C of each of the plurality of battery controllers $SC_1 \sim SC_n$ from the output of the external power source 50. In the specification, where n≥b>a>0 (each of a and b is a natural number), the battery controller $SC_a$ may be disposed at the upstream of the battery controller $SC_b$, and the battery controller $SC_b$ may be disposed at the downstream of the battery controller $SC_a$. That is, in the series signal channel by the second signal path 120, as the length of signal transmission to the external power source 50 is shorter, the battery controller may be disposed at the upstream, and as the length of signal transmission to the external power source 50 is longer, the battery controller may be disposed at the downstream.

The input terminal B and the output terminal C of each of the plurality of battery controllers $SC_1 \sim SC_n$ are coupled with a daisy chain through the second signal path 120. In detail, the input terminal B of the first battery controller $SC_1$ may be coupled to the external power source 50 by the second signal path 120. In case that the battery pack BP is installed in the electric vehicle 1, the high level voltage from the external power source 50 is applied to the input terminal B of the first battery controller $SC_1$ disposed at the most upstream through the second signal path 120. The output terminal C of the first battery controller $SC_1$ is coupled to the input terminal B of the second battery controller $SC_2$ by the second signal path 120. When i is a natural number of 2~n, the input terminal B of the $i^{th}$ battery controller $SC_i$ is coupled to the output terminal C of the $i-1^{th}$ battery controller $SC_{i-1}$ by the second signal path 120. Accordingly, a series communication channel in which the input terminal B and the output terminal C of each of the plurality of battery controllers $SC_1 \sim SC_n$ are connected in a sequential order is formed from the external power source 50 to the output terminal C of the $n^{th}$ battery controller $SC_n$.

The check terminal D of the battery controller $SC_j$ is coupled to the third signal path 130. The third signal path 130 may be a parallel communication channel connected in common to the check terminal D of each of the plurality of battery controllers $SC_1 \sim SC_n$. That is, as shown, the check terminals D of all the plurality of battery controllers $SC_1 \sim SC_n$ are connected in parallel by the third signal path 130.

The output terminal C and the check terminal D of the $n^{th}$ battery controller $SC_n$ disposed at the most downstream are connected in common to a node N. Referring to FIG. 2, the output terminal C of the $n^{th}$ battery controller $SC_n$ is coupled to the node N through the second signal path 120, and the check terminal D of the $n^{th}$ battery controller $SC_n$ is coupled to the node N through the third signal path 130. That is, the third signal path 130 may be coupled to the second signal path 120 through the node N. Accordingly, when the $n^{th}$ battery controller $SC_n$ outputs a specific voltage level (for example, the high level voltage) of signal from its output terminal C, the corresponding signal may be inputted to the check terminals D of all the plurality of battery controllers $SC_1 \sim SC_n$ through the third signal path 130 substantially at the same time.

In the specification, a terminal in 'high state H' indicates that the high level voltage is being inputted or outputted. Additionally, in the specification, a terminal in 'low state L' indicates that a low level voltage is being inputted or outputted. In the specification, the low level voltage is the concept that is contrary to the high level voltage, and represents a voltage signal having a voltage level lower than the predetermined voltage.

Figure 3:
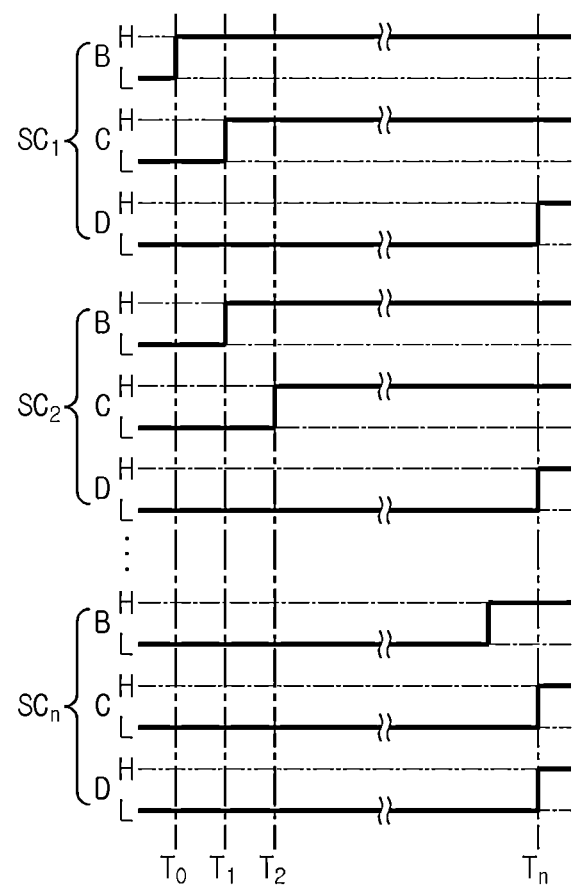
FIG. 3 is a timing chart schematically showing an ID setting sequence using the signal network of FIG. 2.

FIG. 3 is a timing chart schematically showing the ID setting sequence using the signal network of FIG. 2. Before the battery control system 100 is coupled to the external power source 50, all the plurality of battery controllers $SC_1 \sim SC_n$ may be in an ID setting standby state. The ID setting standby state indicates that all of the input terminal B, the output terminal C and the check terminal D of the battery controller SC have the low state L.

Referring to FIGS. 1 to 3, at time point $T_0$, the input terminal B of the first battery controller $SC_1$ is shifted from the low state L to the high state H by the high level voltage from the external power source 50.

The first battery controller $SC_1$ sets its ID in response to the input terminal B of the first battery controller $SC_1$ being the high state H. Before the time point $T_0$, an ID is set for none of the plurality of battery controllers $SC_1 \sim SC_n$. That is, the maximum value of the ID information collected through the first signal path 110 before the time point $T_0$ is equal to the initial value. Assume that the initial value is 0. The first battery controller SC sets 1, which is the sum of the initial value of 0 and a predetermined increment of 1, as its ID, and transmits data indicating the set ID to the first signal path 110 at least one time after the time point $T_0$. Accordingly, it may be determined that the ID of the first battery controller $SC_1$ was set based on the ID information collected by the battery controller $SC_2 \sim SC_n$ disposed at the downstream of the first battery controller $SC_1$ through the first signal path 110. Subsequently, at time point $T_1$, the first battery controller $SC_1$ may output the high level voltage from the output terminal C of the first battery controller $SC_1$.

At the time point $T_1$, the input terminal B of the second battery controller $SC_2$ is shifted from the low state L to the high state H by the high level voltage from the output terminal C of the first battery controller $SC_1$. The second battery controller $SC_2$ sets its ID in response to the input terminal B of the second battery controller $SC_2$ being the high state H. As only the ID of the first battery controller $SC_1$ was set until the time point $T_1$, the maximum value of the ID information will be 1. The second battery controller $SC_2$ sets 2, which is the sum of the maximum value 1 of the ID information and the increment 1, as its ID, and transmits data indicating the set ID to the first signal path 110 at least one time. Accordingly, it may be determined that the ID of the second battery controller $SC_2$ was set based on the ID information collected by the battery controller $SC_3$~$SC_n$ disposed at the downstream of the second battery controller $SC_2$ through the first signal path 110. Subsequently, at time point $T_2$, the second battery controller $SC_2$ may output the high level voltage from the output terminal C of the second battery controller $SC_2$.

The above-described process is repeated until the ID of the $n^{th}$ battery controller $SC_n$ disposed at the most downstream is set. When the ID is set for each battery controller, each battery controller may periodically or aperiodically output data indicating the ID to the first signal path 110 multiple times until the ID setting sequence is completed for all the plurality of battery controllers $SC_1$~$SC_n$.

In the ID setting sequence according to FIG. 2, in the ID setting from the first battery controller $SC_1$ to the $n^{th}$ battery controller $SC_n$, the ID of each battery controller SC has been described as being set in ascending order by the increment from 1. However, this is provided for illustration, and the scope of the present disclosure is not limited thereto. Further, the initial value and the increment may be values other than 0 and 1, respectively.

At time point $T_n$ after the ID of the $n^{th}$ battery controller $SC_n$ is set, the $n^{th}$ battery controller $SC_n$ may output the high level voltage from its output terminal C.

At the time point $T_n$, the high level voltage outputted from the output terminal C of the $n^{th}$ battery controller $SC_n$ is applied to the third signal path 130 electrically coupled to the output terminal C of the $n^{th}$ battery controller $SC_n$ through the node N. Accordingly, the check terminals D of all the plurality of battery controllers $SC_1$~$SC_n$ are shifted from the low state L to the high state H.

In response to its check terminal D being the high state H, the battery controller $SC_j$ may transmit a response signal indicating that the ID setting of the battery controller $SC_j$ is completed to the first signal path 110, and shift its output terminal C from the high state H to the low state L. Accordingly, it is possible to save the power unnecessarily consumed to keep the output terminal C in the high state H, and remove the risk of an electrical circuit of other electrical component in the battery pack BP.

Figure 4:
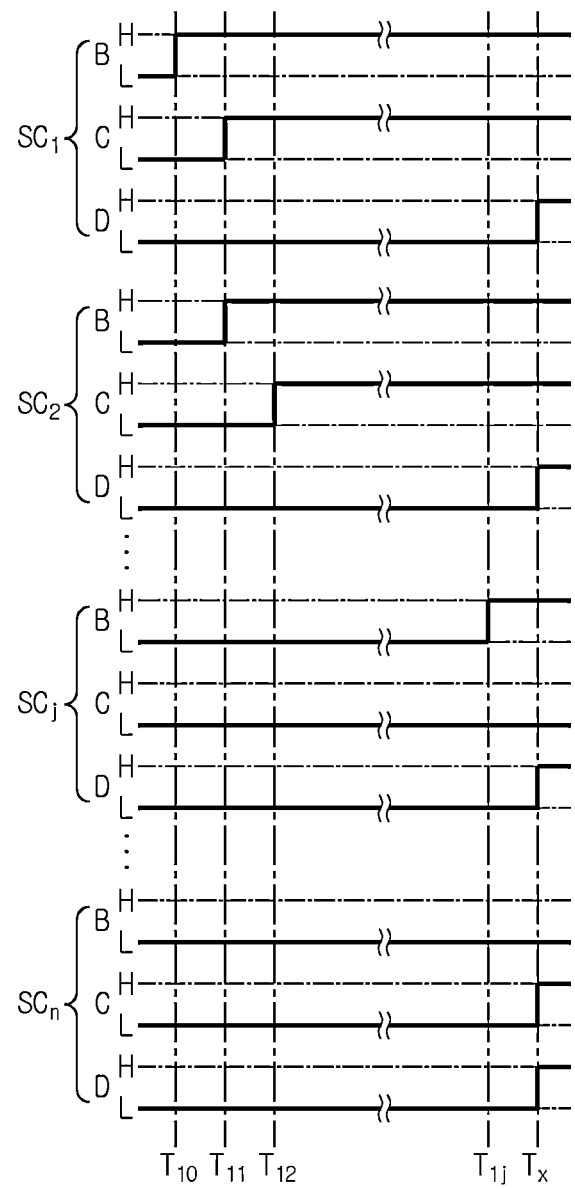
FIG. 4 is a timing chart referenced in describing the detection of an error situation in progress of an ID setting sequence using the signal network of FIG. 2.

FIG. 4 is a timing chart referenced in describing the detection of an error situation in progress of the ID setting sequence using the signal network of FIG. 2.

In FIG. 4, a process from time point $T_{10}$ to time point $T_{12}$ is the same as the process from the time point $T_0$ to the time point $T_2$ shown in FIG. 3, and repetitive descriptions are omitted herein.

Referring to FIG. 4, at time point $T_{1j}$ when the input terminal B of the $j^{th}$ battery controller $SC_j$ is shifted from the low state L to the high state H, the ID setting procedure for the $j^{th}$ battery controller $SC_j$ starts. In this instance, at time point Tx of the period during which the output terminal C of the $j^{th}$ battery controller $SC_j$ is kept in the low state L, the check terminals D of all the plurality of battery controllers $SC_1$~$SC_n$ have been unintentionally shifted from the low state L to the high state H. This indicates that any defect occurs in the time point Tx. In an example, when the third signal path 130 is electrically shorted directly to the external power source 50 at the time point Tx, the situation of FIG. 3 may occur. In another example, when the output terminal C and/or the check terminal D of the $n^{th}$ battery controller $SC_n$ is shifted from the low state L to the high state H at the time point Tx due to maloperation of the $n^{th}$ battery controller $SC_n$, the situation of FIG. 3 may occur.

When the output terminal C of the $j^{th}$ battery controller $SC_j$ is kept in the low state L but the check terminal D of the $j^{th}$ battery controller $SC_j$ is shifted from the low state L to the high state H, the $j^{th}$ battery controller $SC_j$ may output an error message from its communication terminal A.

When the input terminal B of the $j^{th}$ battery controller $SC_j$ is kept in the low state L but the output terminal C and/or the check terminal D of the $j^{th}$ battery controller $SC_j$ is shifted from the low state L to the high state H, the $j^{th}$ battery controller $SC_j$ may output an error message from its communication terminal A.

When the error message is received through the first signal path 110, each of the plurality of battery controllers $SC_1$~$SC_n$ may perform an error removal operation in response to the received error message. The error removal operation may include, for example, initiating the ID already set or resetting the communication unit 13. When the error message is received through the first signal path 110, the upper level controller MC may disallow the turn-on of the relay 20 in response to the received error message.

After the error removal operation is performed, each of the plurality of battery controllers $SC_1$~$SC_n$ may output an error removal message through the first signal path 110 in response to both the output terminal C and the check terminal D having the low state L. The error removal message indicates that the error situation was resolved by the error removal operation. When the error removal message is received through the first signal path 110, the upper level controller MC may allow the turn-on of the relay 20.

Figure 5:
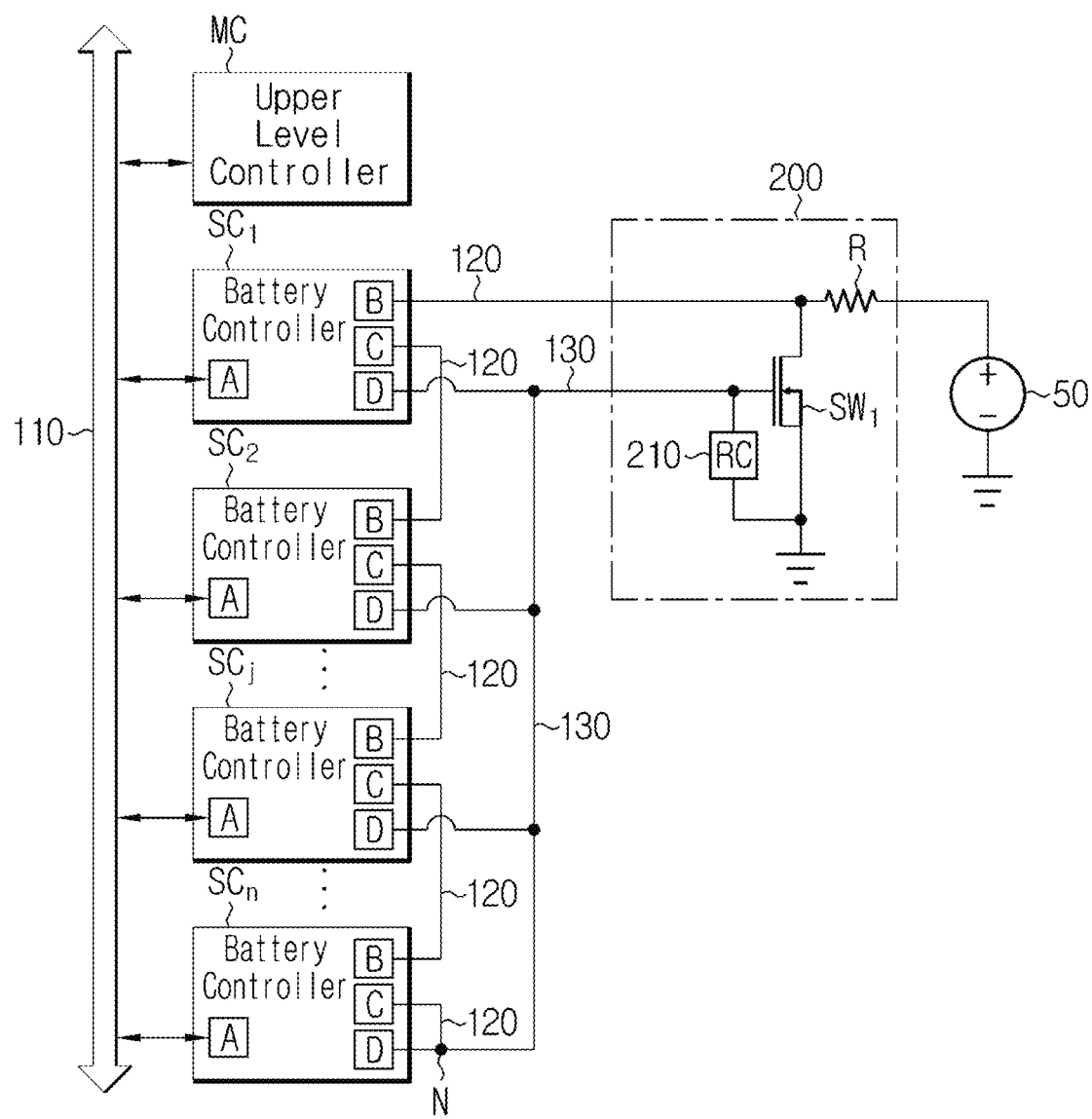
FIG. 5 is a diagram schematically showing a signal network for setting IDs of a plurality of battery controllers according to a second embodiment of the present disclosure.

FIG. 5 is a diagram schematically showing a signal network for setting IDs of a plurality of battery controllers according to a second embodiment of the present disclosure.

The second embodiment of FIG. 5 is different from the first embodiment of FIG. 2 in that the battery control system 100 further includes a sequence termination circuit 200. Accordingly, in describing the second embodiment, repetitive descriptions in common with the first embodiment are omitted herein.

Referring to FIG. 5, the sequence termination circuit 200 includes a resistor R and a switch $SW_1$. A series circuit of the resistor R and the switch $SW_1$ is electrically coupled between the output of the external power source 50 and the ground. The input terminal B of the first battery controller $SC_1$ is connected to the external power source 50 through the resistor R. That is, the input terminal B of the first battery controller $SC_1$ is coupled to a connection point of the resistor R and the switch $SW_1$.

In FIG. 5, for example, an N-channel MOSFET is used as the switch $SW_1$. The drain and source of the N channel MOSFET are electrically coupled to the resistor R and the ground respectively. The gate of the N-channel MOSFET is electrically coupled to the third signal path 130. The sequence termination circuit 200 may further include an RC circuit 210. The RC circuit 210 may be a parallel circuit of a resistor and a capacitor, and protects the switch $SW_1$ by suppressing a rapid voltage change in gate-source voltage of the switch $SW_1$.

When the ID setting is normally completed from the first battery controller $SC_1$ to the $n^{th}$ battery controller $SC_n$, the third signal path 130 has the high level voltage as described above.

The switch $SW_1$ is turned off in response to the third signal path 130 having the low level voltage. The switch $SW_1$ is turned on in response to the third signal path 130 having the high level voltage. When the switch $SW_1$ is turned on, a current path is formed between the resistor R and the ground, and the input terminal B of the first battery controller $SC_1$ is shifted from the high state H to the low state L. That is, the high level voltage from the external power source 50 is shut off from the input terminal B of the first battery controller $SC_1$. Accordingly, compared to when the ID setting sequence was normally completed but the input terminal B of the first battery controller $SC_1$ is kept in the high state H by the external power source 50, it is possible to reduce the risk of an electrical short with other electrical component.

Figure 6:
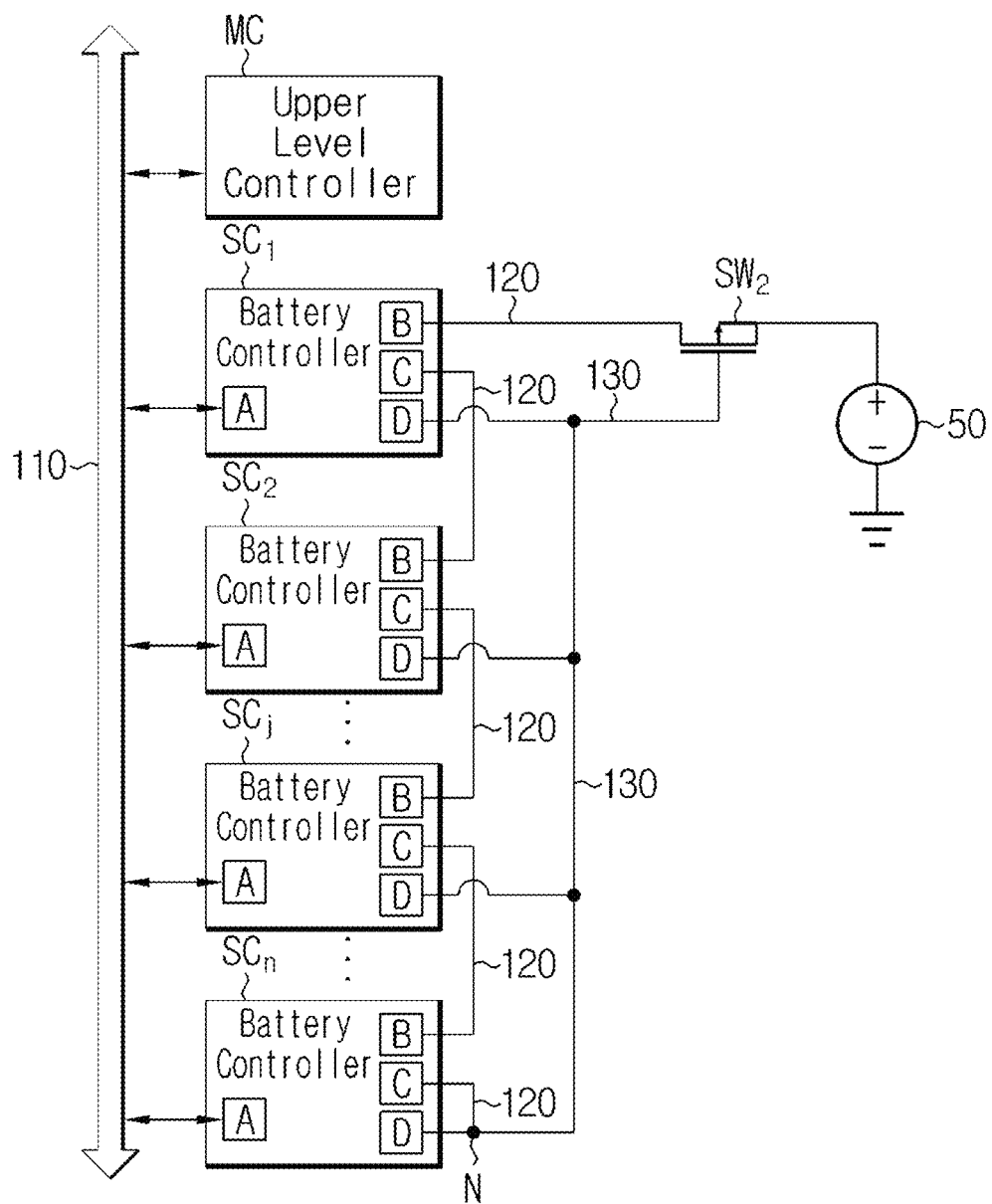
FIG. 6 is a diagram schematically showing a signal network for setting IDs of a plurality of battery controllers according to a third embodiment of the present disclosure.

FIG. 6 is a diagram schematically showing a signal network for setting IDs of a plurality of battery controllers according to a third embodiment of the present disclosure.

The third embodiment of FIG. 6 is different from the first embodiment of FIG. 2 in that the battery control system 100 further includes a switch $SW_2$. Accordingly, in describing the third embodiment, repetitive descriptions in common with the first embodiment are omitted herein.

The switch $SW_2$ is coupled between the external power source 50 and the input terminal B of the first battery controller $SC_1$. In FIG. 6, for example, a P-channel MOSFET is used as the switch $SW_2$. The drain and source of the P-channel MOSFET are electrically coupled to the input terminal B of the first battery controller SC and the output of the external power source 50 respectively. The gate of the P-channel MOSFET is electrically coupled to the third signal path 130.

The switch $SW_2$ is turned on in response to the third signal path 130 having the low level voltage. Accordingly, while the output terminal C of the $n^{th}$ battery controller $SC_n$ is kept in the low state L, the input terminal B of the first battery controller $SC_1$ is kept in the high state H by the external power source 50.

The switch $SW_2$ is turned off in response to the third signal path 130 having the high level voltage. When the switch $SW_2$ is turned off, the input terminal B of the first battery controller $SC_1$ is shifted from the high state H to the low state L. That is, the high level voltage from the external power source 50 is shut off from the input terminal B of the first battery controller $SC_1$. Accordingly, compared to when the ID setting sequence was normally completed but the input terminal B of the first battery controller $SC_1$ is kept in the high state H, it is possible to reduce the risk of an electrical short with other electrical component.

Figure 7:
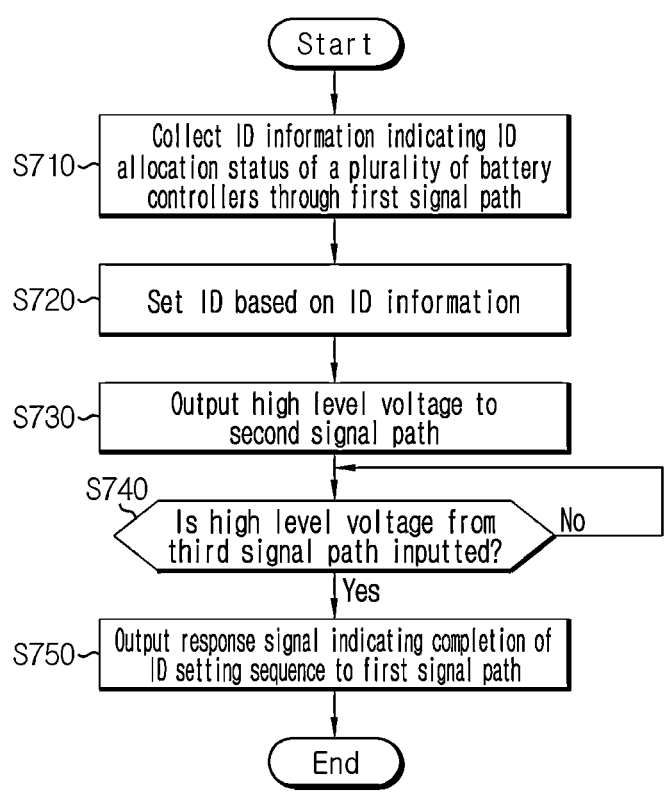
FIG. 7 is a flowchart schematically showing a control method for setting an ID of a battery controller.

FIG. 7 is a flowchart schematically showing a control method for setting an ID of a battery controller. The method of FIG. 7 may start when the input terminal B of the $j^{th}$ battery controller $SC_j$ whose ID is not set is shifted from low to high level. The method of FIG. 7 relates to the ID setting sequence of the $j^{th}$ battery controller $SC_j$, and is equally applied to each of the plurality of battery controllers $SC_1 \sim SC_n$.

Referring to FIGS. 1 to 7, in step S710, the $j^{th}$ battery controller $SC_j$ collects ID information indicating the ID allocation status of the plurality of battery controllers $SC_1 \sim SC_n$ through the first signal path 110.

In step S720, the $j^{th}$ battery controller $SC_j$ sets an ID of the $j^{th}$ battery controller $SC_j$ based on the ID information. The $j^{th}$ battery controller $SC_j$ may output data indicating the ID set for the $j^{th}$ battery controller $SC_j$ to the first signal path 110.

In step S730, the $j^{th}$ battery controller $SC_j$ outputs a high level voltage to the second signal path 120. That is, the $j^{th}$ battery controller $SC_j$ shifts the output terminal C of the $j^{th}$ battery controller $SC_j$ from the low state L to the high state H.

In step S740, the $j^{th}$ battery controller $SC_j$ determines whether the high level voltage from the third signal path 130 was inputted to the check terminal D of the $j^{th}$ battery controller $SC_j$. That is, the $j^{th}$ battery controller $SC_j$ determines whether the check terminal D of the $j^{th}$ battery controller $SC_j$ was shifted from the low state L to the high state H. When a value of the step S740 is "Yes", step S750 is performed. When the check terminal D of the $j^{th}$ battery controller $SC_j$ is not shifted from the low state L to the high state H at the lapse of a predetermined time after the time point at which the output terminal C of the $j^{th}$ battery controller $SC_j$ is shifted from the low state L to the high state H, the $j^{th}$ battery controller $SC_j$ may output an error message.

In step S750, the $j^{th}$ battery controller $SC_j$ outputs a response signal indicating the completion of the ID setting sequence of the $j^{th}$ battery controller $SC_j$ to the first signal path 110. The response signal may include a value of the ID set to the $j^{th}$ battery controller $SC_j$.

The response signal outputted by each battery controller is inputted to the upper level controller MC or the battery controller (for example, $SC_1$) in charge of the function (position) of the upper level controller MC through the first signal path 110.

When the number of times the response signal has been received and/or the maximum value of the ID included in the response signal is equal to the maximum value of the ID information, the upper level controller MC or the battery controller (for example, $SC_1$) in charge of the function (position) of the upper level controller MC may determine that the ID setting has been normally completed for all the plurality of battery controllers $SC_1 \sim SC_n$, and otherwise, may output the error message to the first signal path 110. The number of times the response signal has been received may be the total number of response signals sequentially outputted to the first signal path 110 for the period during which a predetermined standby time has passed since the start of the ID setting sequence.

When it is determined that the ID setting has been normally completed, the upper level controller MC or the battery controller (for example, $SC_1$) in charge of the function (position) of the upper level controller MC may control the plurality of battery controllers $SC_1 \sim SC_n$ using each ID.

Figure 8:
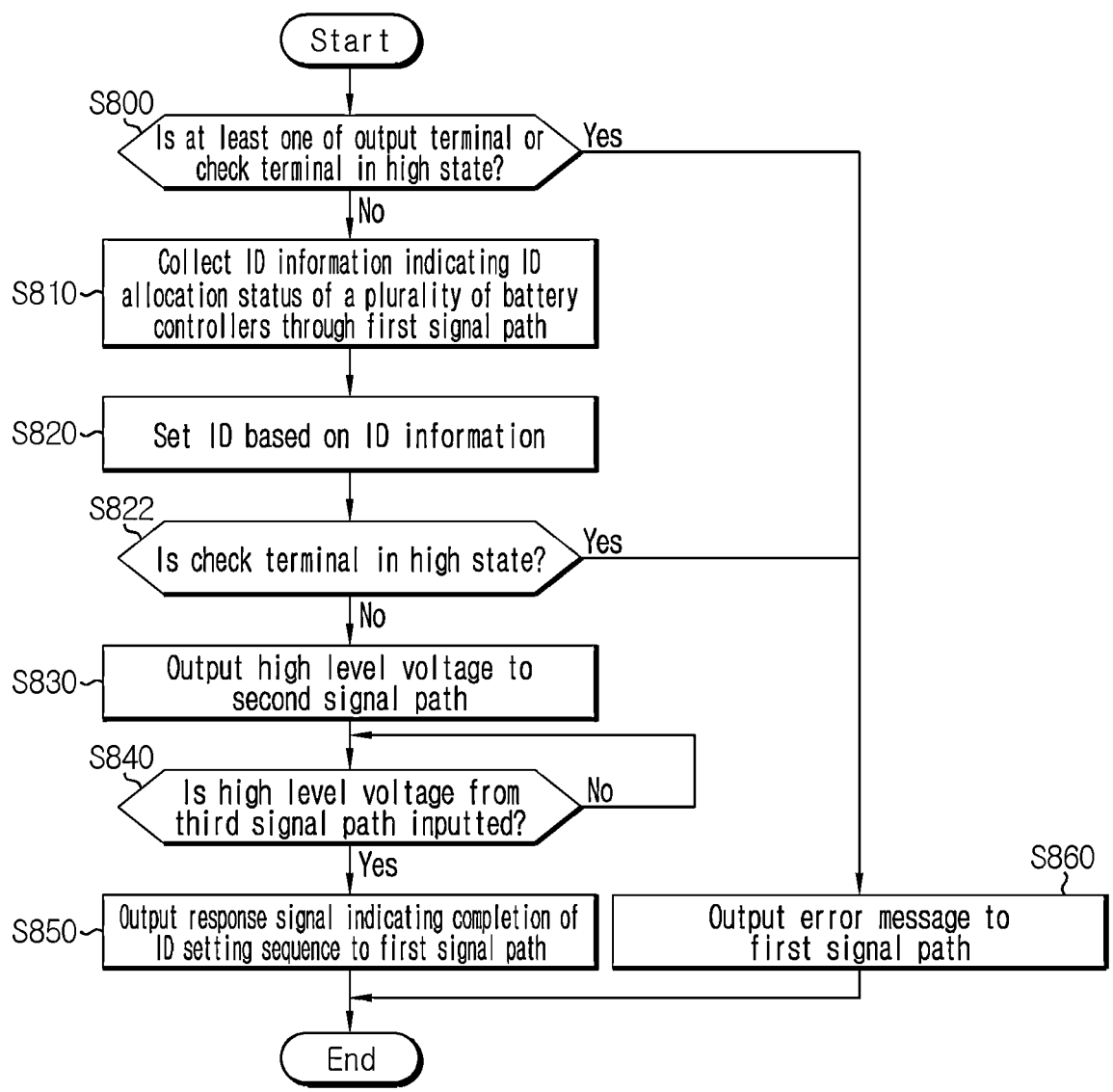
FIG. 8 is a flowchart schematically showing another control method for setting an ID of a battery controller.

FIG. 8 is a flowchart schematically showing another control method for setting an ID of a battery controller. The method of FIG. 8 may start when the input terminal B of the $j^{th}$ battery controller SC whose ID is not set is shifted from low to high level. The method of FIG. 8 relates to the ID setting sequence of the $j^{th}$ battery controller $SC_j$, and is equally applied to each of the plurality of battery controllers $SC_1 \sim SC_n$.

Referring to FIGS. 1 to 6 and 8, in step S800, the $j^{th}$ battery controller $SC_j$ determines whether at least one of the output terminal C or the check terminal D of the $j^{th}$ battery controller $SC_j$ is in the high state H. When a value of the step S800 is "No", step S810 is performed. When the value of the step S800 is "Yes", the step S860 is performed.

In step S810, the $j^{th}$ battery controller $SC_j$ collects ID information indicating the ID allocation status of the plurality of battery controllers $SC_1$~$SC_n$ through the first signal path 110.

In step S820, the $j^{th}$ battery controller $SC_j$ sets an ID of the $j^{th}$ battery controller $SC_j$ based on the ID information. The $j^{th}$ battery controller $SC_j$ may output data indicating the ID set for the $j^{th}$ battery controller $SC_j$ to the first signal channel at least one time.

In step S822, the $j^{th}$ battery controller $SC_j$ determines whether the check terminal D of the $j^{th}$ battery controller $SC_j$ is in the high state H. When a value of the step S822 is "Yes", step S860 is performed. When the value of the step S822 is "No", the step S830 is performed.

In step S830, the $j^{th}$ battery controller $SC_j$ outputs a high level voltage to the second signal path 120. That is, the $j^{th}$ battery controller $SC_j$ shifts the output terminal C of the $j^{th}$ battery controller $S_jC$ from the low state L to the high state H.

In step S840, the $j^{th}$ battery controller $SC_j$ determines whether the high level voltage from the third signal path 130 was inputted to the check terminal D of the $j^{th}$ battery controller SQ. That is, the $j^{th}$ battery controller SC determines whether the check terminal D of the $j^{th}$ battery controller SC was shifted from the low state L to the high state H. When a value of the step S840 is "Yes", step S850 is performed. When the check terminal D of the $j^{th}$ battery controller $SC_j$ is not shifted from the low state L to the high state H at the lapse of a predetermined time from the time point at which the output terminal C of the $j^{th}$ battery controller $SC_j$ is shifted from the low state L to the high state H, step S860 may be performed.

In step S850, the $j^{th}$ battery controller $SC_j$ outputs a response signal indicating the completion of the ID setting sequence of the $j^{th}$ battery controller $SC_j$ to the first signal path 110.

In step S860, the $j^{th}$ battery controller $SC_j$ outputs an error message to the first signal path 110.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A battery control system, comprising:
   first to third signal paths; and
   first to $n^{th}$ battery controllers interconnected through the first to third signal paths, n being a natural number greater than or equal to 2,
   wherein the first battery controller is configured to, when a high level voltage as a command to start an ID setting sequence is inputted to the first battery controller through the second signal path:
      collect ID information indicating an ID allocation status of the first to $n^{th}$ battery controllers through the first signal path,
      set an ID of the first battery controller, based on the ID information, and
      output the high level voltage to the second battery controller through the second signal path,
   wherein an $i^{th}$ battery controller, among the n battery controllers, i being a natural number greater than or equal to 2 and less than or equal to n, is configured to, when the high level voltage outputted by the $i-1^{th}$ battery controller is inputted to the $i^{th}$ battery controller through the second signal path:
      collect the ID information through the first signal path,
      set an ID of the $i^{th}$ battery controller, based on the ID information collected by the $i^{th}$ battery controller, and
      output the high level voltage to the second signal path,
   wherein the high level voltage outputted to the second signal path by the $n^{th}$ battery controller is inputted to all the first to $n^{th}$ battery controllers through the third signal path, and
   wherein each battery controller is configured to output a response signal indicating completion of the ID setting sequence to the first signal path when the high level voltage is inputted through the third signal path.

2. The battery control system according to claim 1, wherein:
   each battery controller includes:
      a communication terminal;
      an input terminal;
      an output terminal; and
      a check terminal;
   the communication terminal of each battery controller is coupled to the first signal path to collect the ID information;
   the input terminal of the first battery controller is coupled to an external power source through the second signal path, the external power source being configured to output the high level voltage;
   an input terminal of the $i^{th}$ battery controller is coupled to an output terminal of the $i-1^{th}$ battery controller through the second signal path, the high level voltage being outputted from the output terminal of the $i-1^{th}$ battery controller; and
   the check terminal of each battery controller is coupled to an output terminal of the $n^{th}$ battery controller through the third signal path.

3. The battery control system according to claim 2, wherein:
   a $j^{th}$ battery controller, among the n battery controllers, is configured to output an error message from a communication terminal of the $j^{th}$ battery controller when the high level voltage is inputted to a check terminal of the $j^{th}$ battery controller, before the high level voltage is outputted from an output terminal of the $j^{th}$ battery controller; and j is a natural number of n or smaller.

4. An ID setting method for the battery control system according to claim 3, the method comprising:
- collecting, by the $j^{th}$ battery controller, the ID information indicating the ID allocation status of the first to $n^{th}$ battery controllers through the first signal path when the high level voltage is inputted to the $j^{th}$ battery controller through the second signal path;
- setting, by the $j^{th}$ battery controller, the ID of the $j^{th}$ battery controller, based on the ID information;
- outputting, by the $j^{th}$ battery controller, the high level voltage to the second signal path, after the ID setting of the $j^{th}$ battery controller is completed; and
- outputting, by the $j^{th}$ battery controller, the response signal indicating completion of the ID setting sequence of the $j^{th}$ battery controller to the first signal path when the high level voltage is inputted to the $j^{th}$ battery controller through the third signal path, after the high level voltage is outputted to the second signal path by the $j^{th}$ battery controller.

5. The battery control system according to claim 2, wherein:
- a $j^{th}$ battery controller, among the n battery controllers, is configured to set an ID of the $j^{th}$ battery controller to be equal to a sum of a maximum value of the ID information collected by the $j^{th}$ battery controller and a predetermined increment; and
- j is a natural number of n or smaller.

6. The battery control system according to claim 2, wherein:
- when an ID of a $j^{th}$ battery controller, among the n battery controllers, is set, the $j^{th}$ battery controller is configured to output the ID set for the $j^{th}$ battery controller through the communication terminal at least one time, while the high level voltage is inputted to the input terminal of the $j^{th}$ battery controller; and
- j is a natural number of n or smaller.

7. The battery control system according to claim 2, wherein:
- when an ID of a $j^{th}$ battery controller, among the n battery controllers, is set, the $j^{th}$ battery controller is configured to output the high level voltage from an output terminal of the $j^{th}$ battery controller, while the high level voltage is inputted to an input terminal of the $j^{th}$ battery controller; and
- j is a natural number of n or smaller.

8. The battery control system according to claim 2, wherein:
- a $j^{th}$ battery controller, among the n battery controllers, is configured to terminate the ID setting sequence in response to the high level voltage being inputted to a check terminal of the $j^{th}$ battery controller, while the high level voltage is outputted from an output terminal of the $j^{th}$ battery controller; and
- j is a natural number of n or smaller.

9. The battery control system according to claim 2, further comprising:
- a sequence termination circuit including:
  - a resistor coupled between the input terminal of the first battery controller and the external power source; and
  - a first switch electrically coupled between the resistor and a ground,
- wherein the first switch is configured to be turned on in response to the high level voltage outputted to the third signal path, and
- wherein, when the first switch is turned on, the high level voltage from the external power source is shut off from the input terminal of the first battery controller.

10. The battery control system according to claim 2, further comprising:
- a sequence termination circuit including a switch coupled between the input terminal of the first battery controller and the external power source,
- wherein the switch is configured to be turned off in response to the high level voltage outputted to the third signal path, and
- wherein, when the switch is turned off, the high level voltage from the external power source is shut off from the input terminal of the first battery controller.

11. A battery pack comprising the battery control system according to claim 1.

12. An electric vehicle, comprising the battery pack according to claim 11.

* * * * *